United States Patent
Schoellkopf et al.

(10) Patent No.: US 6,580,130 B1
(45) Date of Patent: Jun. 17, 2003

(54) PROCESS FOR PRODUCING A RESISTOR IN AN INTEGRATED CIRCUIT AND CORRESPONDING INTEGRATED STATIC RANDOM ACCESS MEMORY DEVICE HAVING FOUR TRANSISTORS AND TWO RESISTORS

(75) Inventors: Jean-Pierre Schoellkopf, Grenoble (FR); Philippe Gayet, St. Vincent de Mercuze (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/460,161

(22) Filed: Dec. 13, 1999

(30) Foreign Application Priority Data

Dec. 14, 1998 (FR) .............................. 98 15769

(51) Int. Cl.$^7$ .............................................. H01L 27/01
(52) U.S. Cl. ........................ 257/350; 257/536; 257/380; 257/358; 257/359; 257/360; 257/363; 257/379; 257/903; 257/904
(58) Field of Search ................................. 257/508, 536, 257/350, 380, 358, 359, 360, 363, 379, 904, 903

(56) References Cited

U.S. PATENT DOCUMENTS

| | | | |
|---|---|---|---|
| 4,146,902 A | | 3/1979 | Tanimoto et al. ............... 357/6 |
| 4,823,179 A | * | 4/1989 | Koshimaru ................. 257/380 |
| 5,126,279 A | * | 6/1992 | Roberts ...................... 257/903 |
| 5,177,030 A | | 1/1993 | Lee et al. ...................... 437/47 |
| 5,327,002 A | * | 7/1994 | Motoyoshi ................... 257/380 |
| 5,474,948 A | * | 12/1995 | Yamazaki .......... 148/DIG. 136 |
| 5,592,013 A | * | 1/1997 | Honda ......................... 257/392 |
| 5,661,325 A | * | 8/1997 | Hayashi et al. ............. 257/393 |
| 5,665,629 A | * | 9/1997 | Chen et al. .................. 438/238 |
| 5,691,217 A | * | 11/1997 | Honeycutt ........... 148/DIG. 14 |
| 5,757,694 A | * | 5/1998 | Mitani ........................ 257/903 |
| 5,811,858 A | * | 9/1998 | Ohkubo ....................... 257/351 |
| 5,841,199 A | * | 11/1998 | Yang ........................... 257/350 |
| 5,952,724 A | * | 9/1999 | Horiba ........................ 257/774 |
| 6,303,966 B1 | * | 10/2001 | Park ............................ 257/379 |

FOREIGN PATENT DOCUMENTS

| | | | | |
|---|---|---|---|---|
| DE | 3813836 | | 11/1989 | .......... H01L/21/72 |
| WO | 84/03587 | | 9/1984 | .......... H01L/21/74 |
| WO | 98/18158 | | 4/1998 | ....... H01L/21/3205 |

* cited by examiner

*Primary Examiner*—Eddie Lee
*Assistant Examiner*—Eugene Lee
(74) *Attorney, Agent, or Firm*—Lisa K. Jorgenson; Allen, Dyer, Doppelt, Milbrath & Gilchrist, P.A.

(57) ABSTRACT

An integrated static random access memory device includes four transistors and two resistors defining a memory cell. The four transistors are in a semiconductor substrate and are mutually interconnected by a local interconnect layer. The local interconnect layer is under a first metal level and a portion of the local interconnect layer defines above the substrate a base metal level. The two resistors extend in contact with a portion of the local interconnect layer between the base metal level and the first metal level.

12 Claims, 5 Drawing Sheets

PROCESS FOR PRODUCING A RESISTOR IN AN INTEGRATED CIRCUIT AND CORRESPONDING INTEGRATED STATIC RANDOM ACCESS MEMORY DEVICE HAVING FOUR TRANSISTORS AND TWO RESISTORS

FIELD OF THE INVENTION

The invention relates to the field of electronics, and, more particularly, to an integrated circuit including a resistor between two metal levels therein, as applied to a memory cell of a static random access memory.

BACKGROUND OF THE INVENTION

A memory cell of a static random access memory typically includes four transistors and two resistors. The four transistors are formed in a semiconductor substrate and are mutually interconnected by a local interconnect layer. However, it is difficult to form the two resistors so that each memory cell is dense. The more dense a memory cell the less space required to form the static random access memory, which is particularly important if the memory incorporates a very large number of memory cells. Consequently, there is a continuing need to form a dense memory cell in a static random access memory.

SUMMARY OF THE INVENTION

An object of the invention is to use the space available between the vertical connections already existing between two metal levels for inserting a resistor there between.

Another object of the invention is to produce high-value resistors in a particularly straightforward manner.

Yet another object of the invention is to produce a particularly dense memory location in static random access memories.

First, a process according to the present invention produces an integrated circuit comprising a resistor placed between two metal levels of the integrated circuit. According to this process, an intermediate metal level is produced on the lower metal level. An electrically conductive layer on the lower face of a first part of the intermediate metal level rests on top of a portion of a metal track of the lower metal level via a thin layer of a dielectric material to form at least a first part of the resistor. The conductive layer is surrounded laterally by an intermediate insulating layer. An upper insulating layer supporting the upper metal level is deposited on the intermediate metal level, and a metal connection or via connects the second part of the conductive layer to a track of the upper metal level.

The dielectric layer portion sandwiched between the lower face of the first part of the electrically conductive layer and the portion of the metal track of the lower metal level forms the dielectric of a capacitor. The two electrodes of the capacitor are formed from the first part of the conductive layer and the metal track portion, respectively. However, the small thickness of this dielectric layer as compared with the thickness of the conductive layer and with that of the metal portion results in the formation of a low-value capacitor. This low-value capacitor leaks its charge when a potential difference is applied to its terminals, and therefore operates as a high-value resistor.

In a first embodiment of the invention, the first and second parts of the electrically conductive layer are identical. Also, the metal connection is produced by etching the upper insulating layer, and stopping on the upper face of the second part of the conductive layer. In other words, this embodiment allows compact vertical resistors to be produced.

Another embodiment includes shifting the second part of the conductive layer with respect to the first part. Starting with this, a first possibility is to produce the metal connection by etching the upper insulating layer, and stopping on the upper face of the second part of the conductive layer. Such an embodiment allows the upper metal level to be connected when it is not possible to produce a vertical resistor.

Another possibility is for the lower face of the second part of the conductive layer to be in contact with the dielectric layer above a portion of another metal track of the lower level. This forms a second part of the resistor electrically connected to the first part via the rest of the conductive layer. Thus, two resistors in series are formed. If required, the connection to the upper metal level is made by a metal connection in contact with another portion of this other metal track of the lower level.

Although the intermediate metal level can be produced in various ways, it is particularly advantageous to produce this metal level using a "damascene" process, which is well known to those skilled in the art. In other words, production of the intermediate metal level comprises deposition of the intermediate insulating layer, etching of this insulating layer to define a cavity at the place where the conductive layer is, and then depositing the dielectric layer on the walls and the bottom of the cavity. The cavity is filled with an electrically conductive material to form the conductive layer.

When the lower metal level is a metal level 0, also called a local interconnect layer by those skilled in the art, the invention is particularly applicable to the production of memory locations having four transistors and two resistors forming a static random access memory.

More specifically, the invention also provides such an integrated static random access memory device having four transistors and two resistors. The four transistors are produced in a semiconductor substrate and are mutually interconnected by a local interconnect layer which lies under a first metal level (metal 1) and which forms, above the substrate, a base metal level (metal 0). The two resistors therefore extend in contact with a part of the local interconnect layer between the base metal level (metal 0) and the first metal level (metal 1). This makes it possible to obtain dense memory locations, thereby significantly minimizing the area of a static random access memory incorporating a very large number of these memory locations.

Several possibilities are presented for forming each of the resistors of this memory location. Each resistor may be formed from a layer of a resistive material resting at its two ends on two portions of the local interconnect layer. It is also possible for each resistor to be formed from a layer of an electrically conductive material. This material rests at its two ends on two portions of the local interconnect layer. A resistor is formed from two thin layers of a dielectric material placed respectively at the two ends of the electrically conductive layer between this electrically conductive layer and the corresponding portion of the local interconnect layer.

Regardless of the embodiments used, even in combination, each resistor contacts on a first local interconnect layer portion for producing the interconnect between the gate of one memory transistor and the drain of the other memory transistor, and contacts on a second local interconnect layer portion connected to the first metal level by a metal interconnect via. The shape of each resistor therefore partially matches a shape of the gate of the memory transistor.

BRIEF DESCRIPTION OF THE DRAWINGS

Further advantages and features of the invention will appear upon examination of the detailed description of non-limiting methods of implementation and embodiments, and of the appended drawings, in which.

DETAILED DESCRIPTION OF THE PREFERRED EMBODIMENTS

Figure 1:
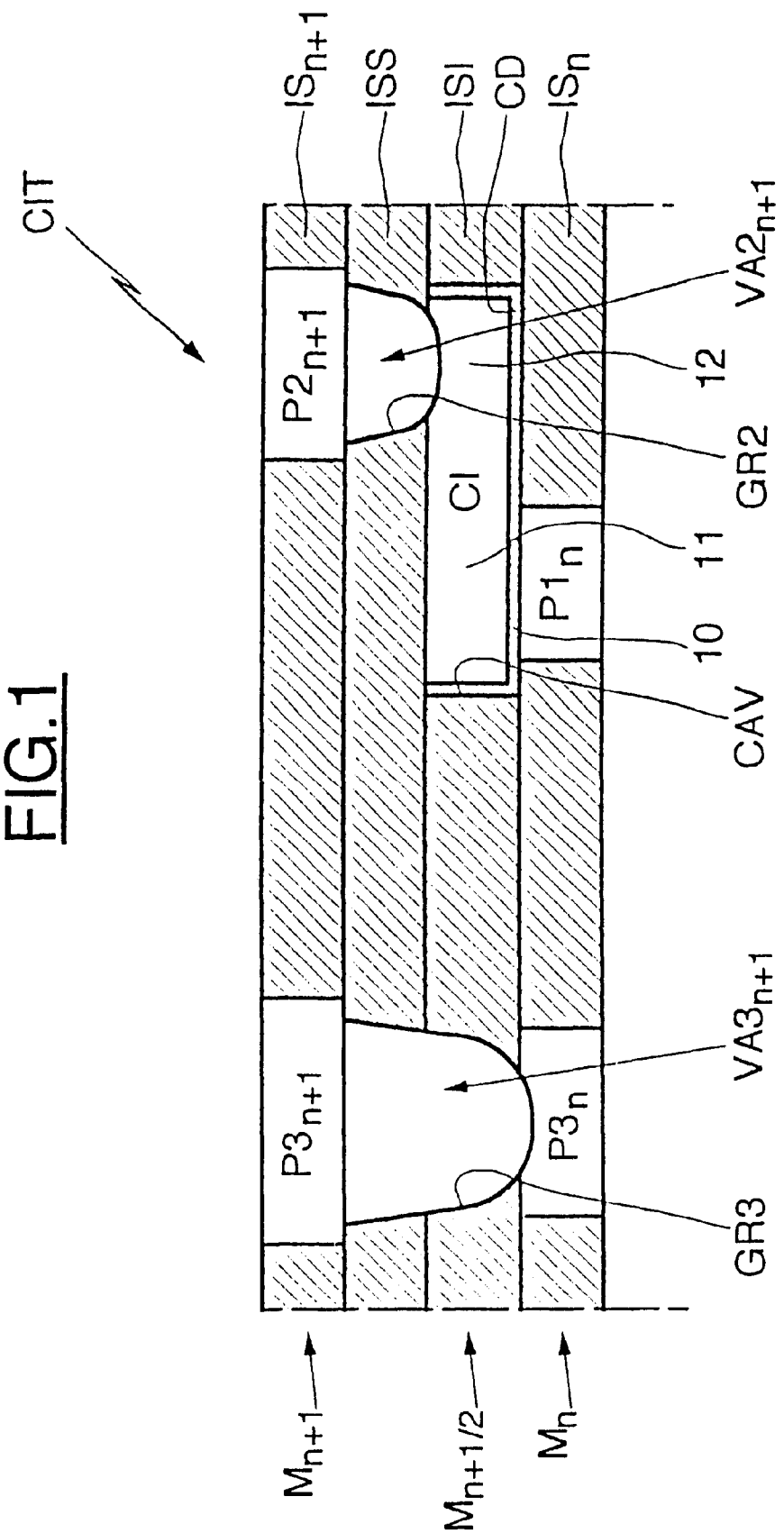
FIG. 1 illustrates a first embodiment of a resistor between two adjacent metal levels of an integrated circuit, according to the present invention.

In FIG. 1, the reference CIT denotes an integrated circuit which includes a metal level $M_n$ (metal n) produced in a conventional manner, as readily understood by one skilled in the art. The metal level $M_n$ includes metal tracks $P1_n$ and $P3_n$ mutually insulated by an insulating layer $IS_n$. The insulating layer $IS_n$ is silicon dioxide, for example, and typically has a thickness of about 200 nm.

An intermediate metal level, referred to as $M_{n+\frac{1}{2}}$, is produced. This intermediate metal level comprises an electrically conductive layer CI formed of tungsten, aluminium or copper, for example. The electrically conductive layer CI is surrounded by an insulating layer called the intermediate insulating layer ISI. It is particularly advantageous to produce this conductive layer CI using a damascene process, as readily understood by one skilled in the art. This process first includes depositing the intermediate insulating layer ISI, such as silicon dioxide, for example, with a thickness of about 300 nm. The intermediate insulating layer ISI is then etched using a specific etching mask to provide a cavity CAV in this layer at the place where the conductive layer CI will be produced. Next, a thin dielectric layer CD is deposited on the layer ISI and in the cavity CAV followed by the electrically conductive material. Finally, a chemical-mechanical polishing operation is carried out to planarize the upper surface of this layer CI.

The layer CD outside the cavity CAV is then removed by this polishing operation. This dielectric layer CD has, for example, a thickness of a few nanometers, or even about ten nanometers, and may, for example, include the same material as that of the insulating layer $IS_n$, i.e., silicon dioxide. Consequently, other dielectric materials, such as silicon nitride or $Ta_2O_5$, for example, could be used.

This layer CI could also have been produced using another process, i.e., deposition of the layer CD followed by a metal layer over the entire metal n. This metal layer n is then etched to form the layer CI and, finally, the insulating layer ISI is deposited. However, the damascene process has the advantage of not impairing the dielectric layer CD during production of the metal layer $M_{n+\frac{1}{2}}$.

Next, another insulating layer, called an upper insulating layer ISS, also having a typical thickness of about 300 nm, is deposited. Using a conventional mask, the insulating layers ISS, ISI and CD are then etched to form respective cavities GR3 and GR2. These cavities will subsequently be filled with a filling metal, e.g., tungsten, to produce vertical metal connections or vias.

Thus, once the upper metal level $M_{n+1}$ has been produced, the via $VA3_{n+1}$ will form the metal interconnect between the track $P3_n$ of the metal n and the track $P3_{n+1}$ of the metal n+1. Likewise, the via $VA2_{n+1}$ will form the interconnect between the conductive layer CI and the track $P2_{n+1}$ of the metal n+1. All the tracks of metal level n+1 are mutually insulated by an insulator $IS_{n+1}$.

The first part 11 of the conductive layer CI shown in FIG. 1 forms, together with that portion of the metal track $P1_n$ which faces it, two electrodes of a capacitor, as readily appreciated by one skilled in the art. The dielectric is the portion 10 of the layer CD which lies between these two electrodes. As a result of the ratio of the thickness of the dielectric layer to the thickness of the metal levels $M_n$ and $M_{n+\frac{1}{2}}$, this capacitor has a low value. This capacitor furthermore has the property of leaking its charge when a potential difference is applied between the tracks $P2_{n+1}$ and $P1_n$.

This low-value capacitor therefore operates as a resistor R having a particularly high resistive value. Thus, with the numerical values indicated above, leakage currents on the order of 9 to 10 amperes at 1 volt are obtained. This results in a resistance value as high as 109 ohms. The ratio of the thickness of the dielectric to the thickness of the electrodes can be adjusted to change the value of the resistor to a desired level. The production of the resistor R only needs a single additional mask, namely, a mask for etching the cavity CAV for forming the layer CI. The other vias of the integrated circuit are produced with usual contact masks.

Figure 2:
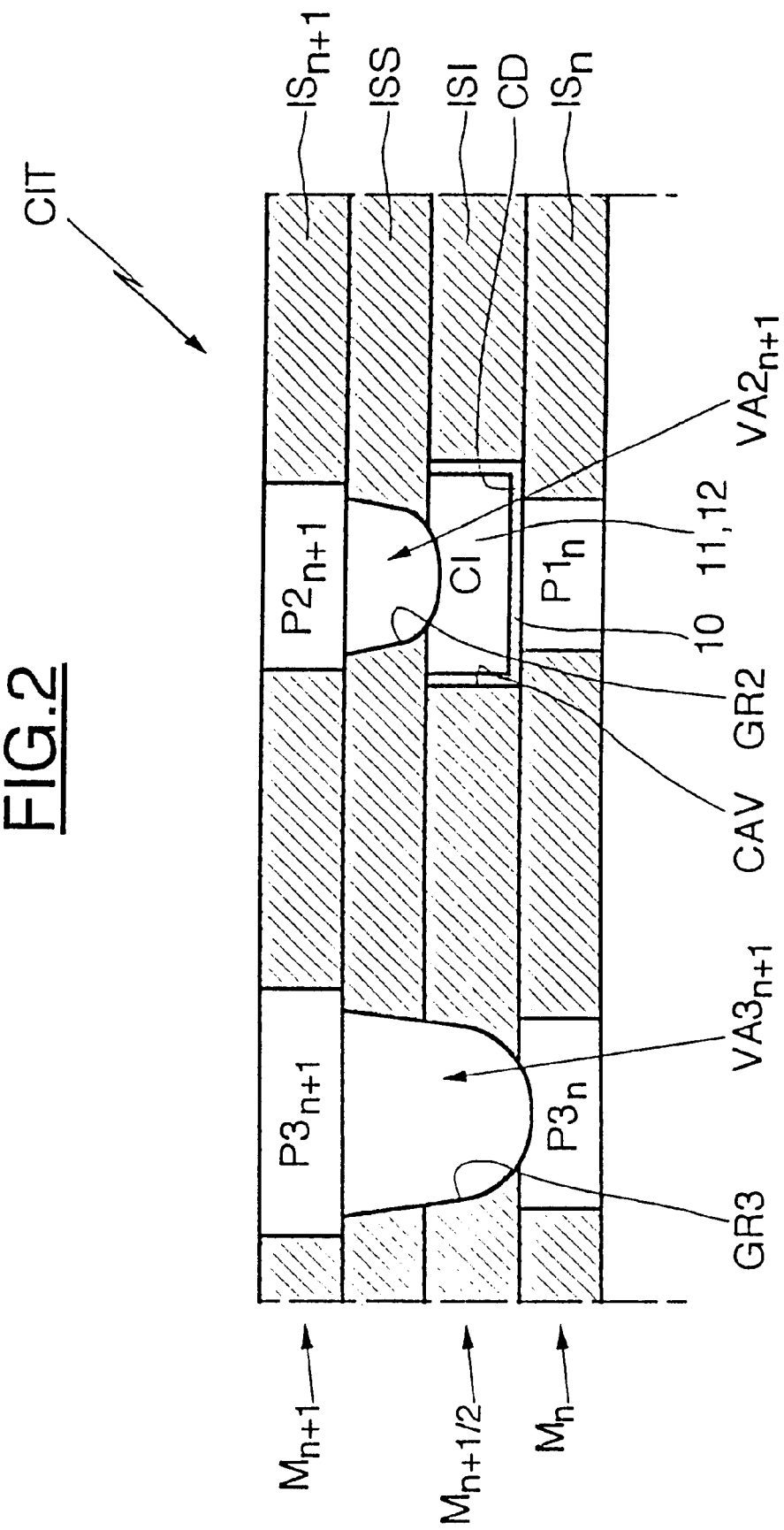
FIG. 2 illustrates a second embodiment of a resistor between two adjacent metal levels of an integrated circuit, according to the present invention.

In FIG. 1, the second part 12 of the conductive layer CI is in contact with the upper surface of the via $VA2_{n+1}$. In FIG. 2, the second part 12 of the conductive layer CI is shifted with respect to the first part 11. These two parts 11 and 12 are identical in FIG. 2.

In FIG. 2, the resistor R is formed from the corresponding leaky capacitor and is particularly compact because of its vertical connection to the metal level $M_{n+1}$ by via $VA2_{n+1}$. Furthermore, when etching the cavity GR2 for the via $VA2_{n+1}$, the conductive layer CI serves as a mask for protecting the dielectric layer CD. The conductive layer CI therefore has several functions. One such function is an electrical function for forming one of the electrodes of the capacitor which is connected to the via VA2n+1. Another function is a mask function for protecting the dielectric layer CD while the cavity GR2 is being etched. This is before the cavity is filled with tungsten to form the via $VA2_{n+1}$.

Figure 3:
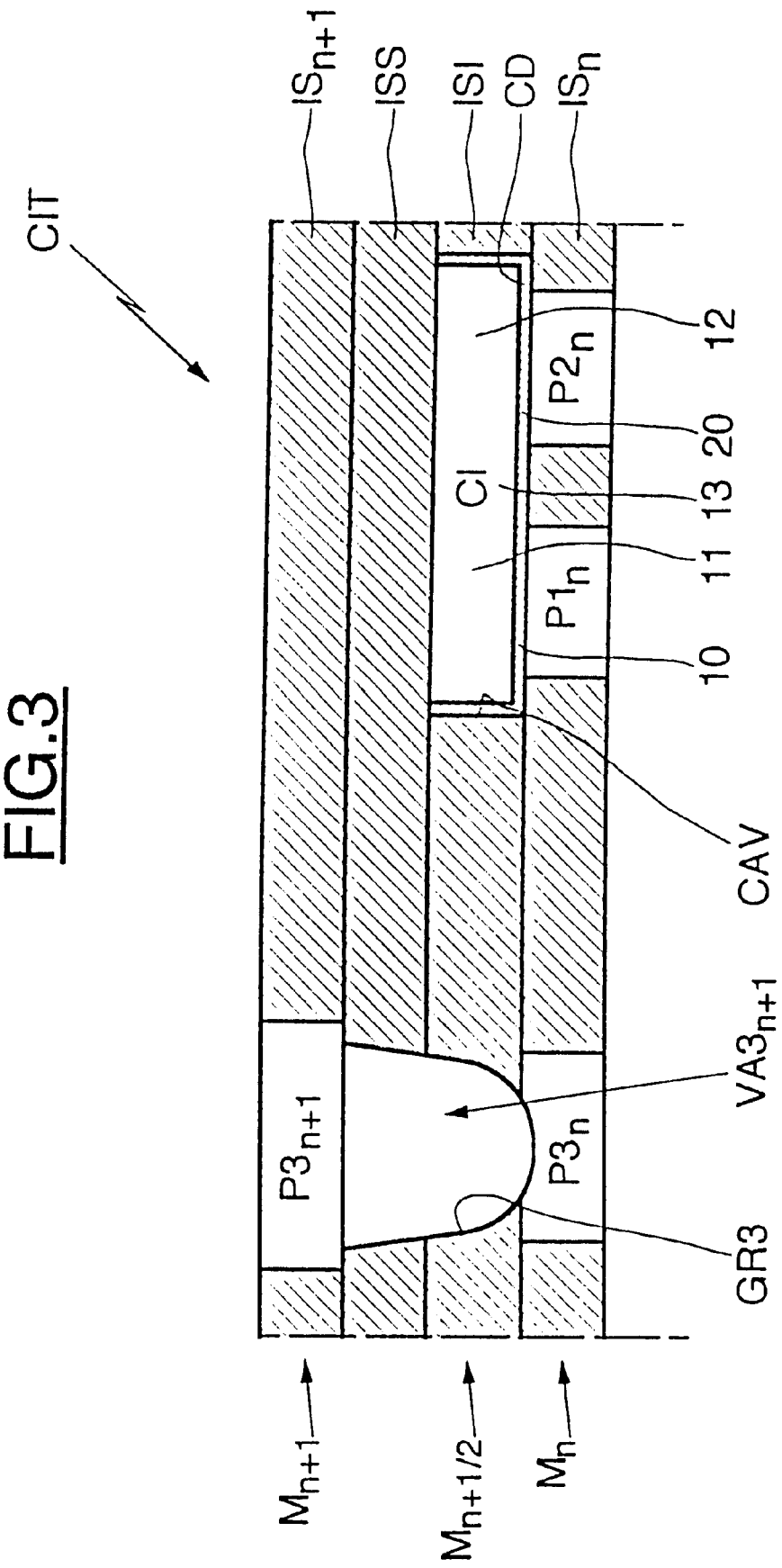
FIG. 3 illustrates a third embodiment of a resistor between two adjacent metal levels of an integrated circuit, according to the present invention.

The embodiment illustrated in FIG. 3 corresponds to a connection of the conductive layer CI, above the layer CI, to the metal level $M_{n+1}$. This connection may not be direct. In this case, the second part 12 of the conductive layer CI, which is shifted with respect to the first part 11, also contacts another portion of another metal track $P2_n$ of the metal level $M_n$ by another part 20 of the dielectric layer CD.

In this case, two resistors have been produced. The resistors are formed respectively by a first capacitor and by a second capacitor. The first resistor includes part 11 of the layer CI, the portion 10 of the layer CD and a portion of the metal track P1n. The second resistor includes part 12 of the layer CI, the portion 20 of the layer CD and a portion of the metal track P2n. These two resistors are electrically connected by the rest 13 of the layer CI.

If R1 and R2 denote the resistances of the two resistors thus formed, the structure illustrated in FIG. 3 is therefore equivalent to a resistor of value R1+R2 connected between the two tracks $P1_n$ and $P2_n$. If necessary, connection to the metal level $M_{n+1}$ may be made by producing a via between, for example, another portion of the metal track $P2_n$ (not shown) and a metal track of the metal level n+1.

Figure 4:
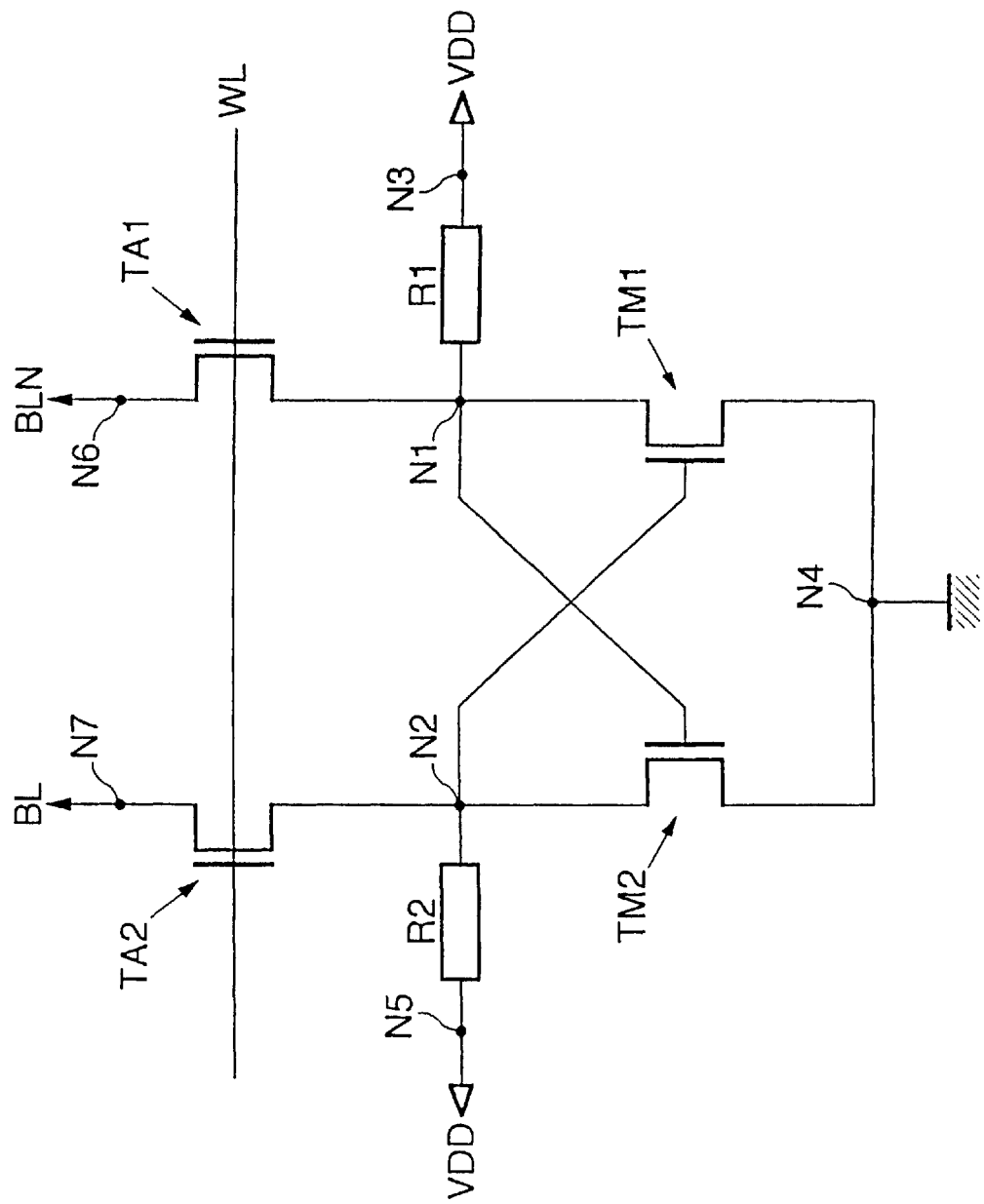
FIGS. 4, 5 and 6 illustrate one application of the present invention, to a static random access memory cell having four transistors and two resistors.

The production of such a resistor is particularly advantageously applicable in the production of a memory location having four transistors and two resistors, as illustrated in FIG. 4. More specifically, this memory location or memory cell comprises two memory transistors TM1 and TM2. The gate of one of the memory transistors is connected to the drain of the other memory transistor. The sources of the two memory transistors are connected to ground (node N4).

The drains of the transistors TM1 and TM2 (node N1 and node N2) are respectively connected to the sources of the access transistors TA1 and TA2, which are themselves connected (node N6 and node N7) to a bit-line BL and to the complementary bit line BLN. The gates of the access transistors TA1 and TA2 are controlled by the word line WL. Two resistors R1 and R2 are connected respectively to the nodes N1 and N2 and to the supply level VDD (nodes N3 and N5).

Figure 5:
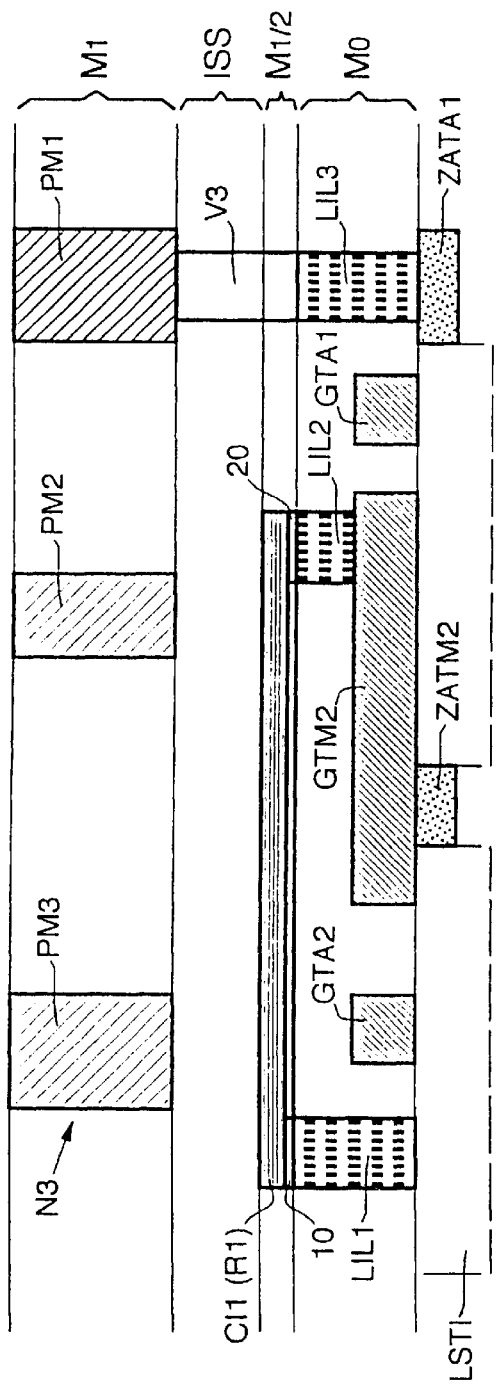
Figure 6:
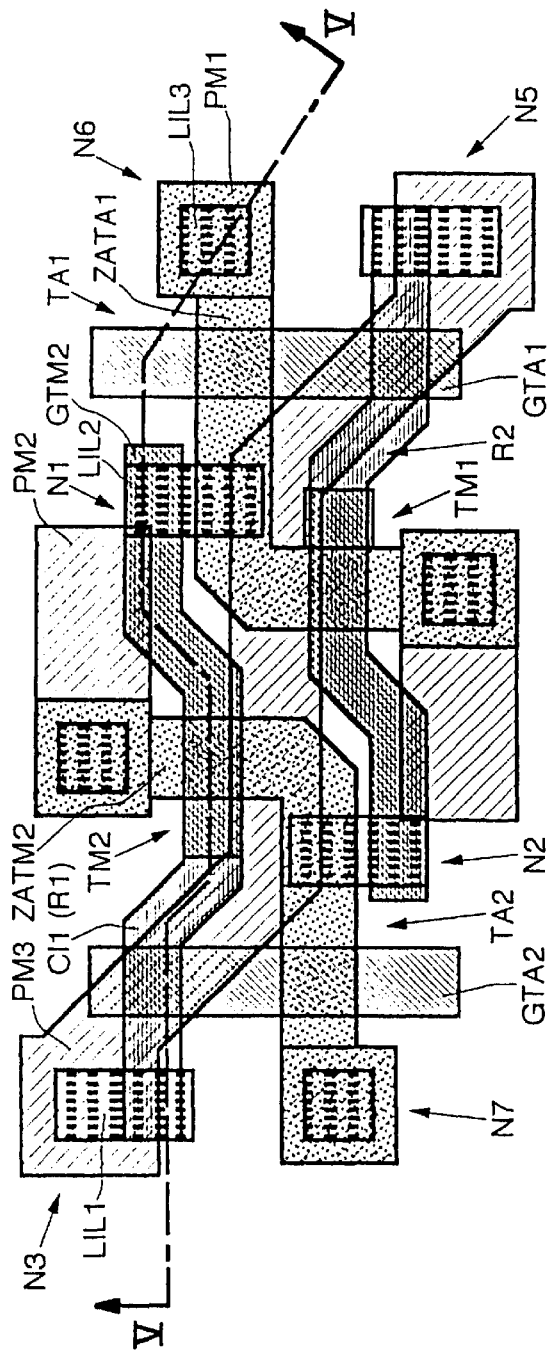

As shown in the simplified diagram in FIG. 6, as well as in the cross section (FIG. 5) on the line V—V in this FIG. 6, the metal level zero M0 makes it possible to produce, using the local interconnect layer portions, the various interconnects between the gates, drains and sources of the various transistors. The reference ZATM2 denotes the active region of the memory transistor TM2 while GTA2 and GTA1 denote the gates of the access transistors TA1 and TA2. LSTI denotes an insulation region in the substrate by a shallow trench.

The local interconnect layer portion LIL2 allows the gate GTM2 of the memory transistor TM2 to be connected to the drain of the transistor TM1. The local layer LIL3 contacts the active region ZATA1 and, more particularly, the source of the access transistor TA1. This allows the track PM1 to be contacted (node N6) by extending via V3 as far as the metal level M1. Likewise, the local layer LIL1, extended by another via (not shown in FIG. 5) as far as the track PM3 of the metal level M1 allows connection to the supply level VDD (node N3).

The track PM2 is connected to ground (source of the transistor TM2) and forms the node N4. The resistor R1 is formed from a conductive layer CI1 which extends to the intermediate metal level M1/2 and rests on two portions of the layers LIL1 and LIL2. In the embodiment illustrated in these figures, the layer CI1 rests on the portions of the local interconnect layers LIL1 and LIL2 using two portions of dielectric layers 10 and 20. The two capacitors thus formed therefore form the resistor R1 by being electrically connected by the rest of the conductive layer CI1.

Moreover, the shape of the resistor R1 (more specifically, the shape of part of layer CI1) partially matches the shape of the gate GTM2 of the memory transistor TM2. This resistor is produced in a similar manner to that described with reference to FIG. 3. Consequently, it would be possible as an alternative embodiment to deposit a layer of a resistive material, such as a material based on titanium nitride or tantanium nitride, directly on the two layers LIL1 and LIL2.

Those skilled in the art will therefore note that the two resistors R1 and R2 are in contact with the metal level 0 and extend between this metal level 0 and the metal level 1. A particularly compact memory location is therefore obtained which avoids the production of resistors outside the active regions of the transistors, and which thus makes it possible to reduce the surface area on the order of approximately 30%.

That which is claimed is:

1. An integrated static random access memory device comprising:

a semiconductor substrate;

at least one memory cell comprising four transistors in said semiconductor substrate;

a local interconnect layer providing connections for said at least one memory cell, said local interconnect layer forming a base metal layer above said semiconductor substrate;

a first metal layer above said local interconnect layer; and said at least one memory cell further comprising two resistors extending in contact with respective first and second portions of said local interconnect layer between the base metal layer and said first metal layer, each resistor comprising an electrically conductive layer having first and second ends resting on the respective first and second portions of said local interconnect layer, a first dielectric layer between the first end of said electrically conductive layer and the first portion of said local interconnect layer, and a second dielectric layer between the second end of said electrically conductive layer and the second portion of said local interconnect layer.

2. A device according to claim 1, wherein two of said four transistors respectively define first and second memory transistors each comprising a gate and a drain; wherein one of the portions of said local interconnect layer for one of the resistors forms an interconnect between the gate of said first memory transistor and the drain of said second memory transistor; and wherein one of the portions of said local interconnect layer for the other resistor forms an interconnect between the gate of said second memory transistor and the drain of said second memory transistor.

3. An integrated static random access memory device comprising:

a semiconductor substrate;

at least one memory cell comprising at least one transistor in said semiconductor substrate;

a local interconnect layer providing connections for said at least one memory cell, said local interconnect layer forming a base metal layer above said semiconductor substrate;

a first metal layer above said local interconnect layer; and said at least one memory cell further comprising at least one resistor extending in contact with respective first and second portions of said local interconnect layer between the base metal layer and said first metal layer, each resistor comprising an electrically conductive layer having first and second ends resting on the respective first and second portions of said local interconnect layer, a first dielectric layer between the first end of said electrically conductive layer and the first portion of said local interconnect layer, and a second dielectric layer between the second end of said electrically conductive layer and the second portion of said local interconnect layer.

4. A device according to claim 3, wherein said at least one transistor comprises at least two memory transistors each comprising a gate and a drain; wherein said at least one resistor comprises at least two resistors; wherein one of the portions of said local interconnect layer for one of the two resistors forms an interconnect between the gate of said first memory transistor and the drain of said second memory transistor; and wherein one of the portions of said local interconnect layer for the other resistor forms an interconnect between the gate of said second memory transistor and the drain of said second memory transistor.

5. A device according to claim 2, further comprising a conducting via for each resistor, with each conducting via for connecting a corresponding resistor to said first metal layer.

6. A device according to claim 2, wherein a shape of each resistor partially matches a shape of the gates of said first and second memory transistors.

7. A device according to claim 4, further comprising a conducting via for each resistor, with each conducting via for connecting a corresponding resistor to said first metal layer.

8. A device according to claim 4, wherein a shape of each resistor partially matches a shape of the gates of said first and second memory transistors.

9. An integrated static random access memory device comprising:
 a semiconductor substrate;
 at least one memory cell comprising at least one transistor in said semiconductor substrate;
 a local interconnect layer providing connections for said at least one memory cell, said local interconnect layer forming a base metal layer above said semiconductor substrate;
 a first metal layer above said local interconnect layer; and
 said at least one memory cell further comprising at least one resistor extending in contact with respective first and second portions of said local interconnect layer between the base metal layer and said first metal layer, each resistor comprising
  an electrically conductive layer having first and second ends resting on the respective first and second portions of said local interconnect layer.

10. A device according to claim 9, wherein said at least one transistor comprises at least two memory transistors each comprising a gate and a drain; wherein said at least one resistor comprises at least two resistors; wherein one of the portions of said local interconnect layer for one of the two resistors forms an interconnect between the gate of said first memory transistor and the drain of said second memory transistor; and wherein one of the portions of said local interconnect layer for the other resistor forms an interconnect between the gate of said second memory transistor and the drain of said second memory transistor.

11. A device according to claim 10, further comprising a conducting via for each resistor, with each conducting via for connecting a corresponding resistor to said first metal layer.

12. A device according to claim 10, wherein a shape of each resistor partially matches a shape of the gates of said first and second memory transistors.

* * * * *